United States Patent [19]

Dupuis

[11] 4,037,772
[45] July 26, 1977

[54] APPARATUS FOR BONDING WIRE LEADS

[75] Inventor: Jean Marcel Dupuis, Ottawa, Canada

[73] Assignee: Northern Telecom Limited, Montreal, Canada

[21] Appl. No.: 729,197

[22] Filed: Oct. 4, 1976

[51] Int. Cl.² .................. B23K 21/02; H01L 21/601
[52] U.S. Cl. ............................. 228/1 R; 29/591; 228/5.1; 228/6 A
[58] Field of Search .............. 228/1, 5.1, 15.1, 6 A, 228/180 A, 32; 29/591, 628, 626, 630 R, 630 B

[56] References Cited

U.S. PATENT DOCUMENTS

| 3,388,848 | 6/1968 | Youmans | 228/1 |
| 3,698,618 | 10/1972 | Helda | 228/1 X |
| 3,882,597 | 5/1975 | Chayka | 29/626 X |
| 3,887,783 | 6/1975 | Comette | 228/5.1 X |
| 3,938,722 | 2/1976 | Kelly | 228/6 A X |

OTHER PUBLICATIONS

Grossman, *Electronics*, "Film-Carrier Technique Automates the Packaging of IC Chips," May 16, 1974, pp. 89-95.

*Primary Examiner*—Al Lawrence Smith
*Assistant Examiner*—Nicholas P. Godici
*Attorney, Agent, or Firm*—Sidney T. Jelly

[57] ABSTRACT

An ultrasonic wobble-bonding apparatus for bonding leads of lead frames has a bonding tool attached to a support member which is mounted on a double axis pivot or trunnion, the pivot or trunnion in turn mounted on a sector bearing. The interception of the two axis is on a center common with the active surface of the bonding tool, the active surface being concave. The tool is moved about the two axes in a predetermined manner such that the common center on the active surface — which is also the contact position between tool and lead frames — follows a predetermined path on the active surface. The pivot and sector bearing are displaced from the bonding tool to leave a clear working space — particularly useful for automatic bonding of leads of lead frames arranged in long strips or coils.

26 Claims, 23 Drawing Figures

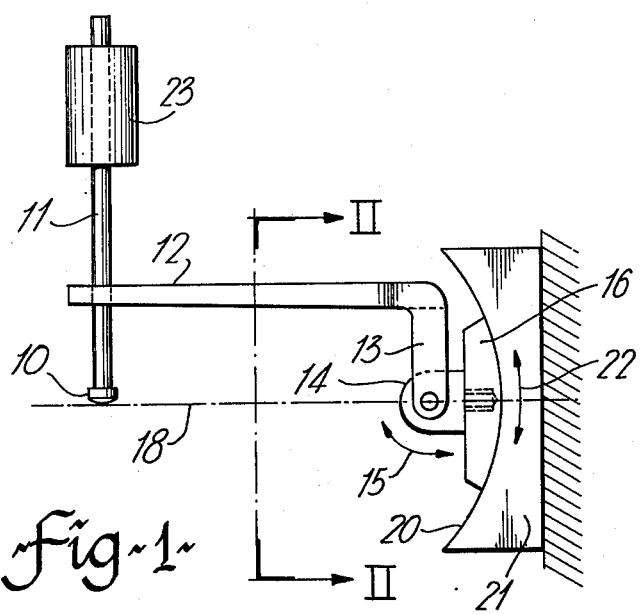
Fig-1-
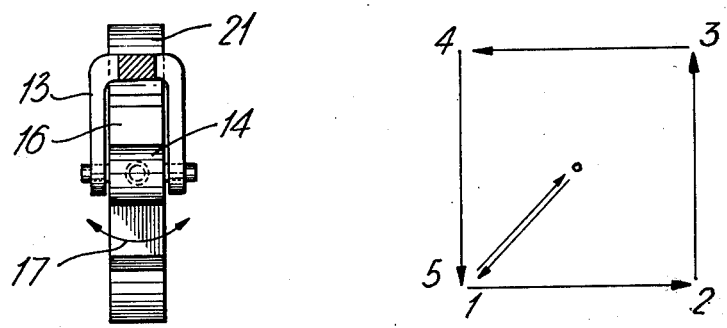
Fig-2-  Fig-4-
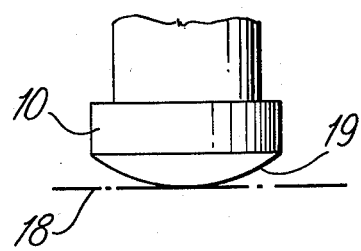
Fig-3-

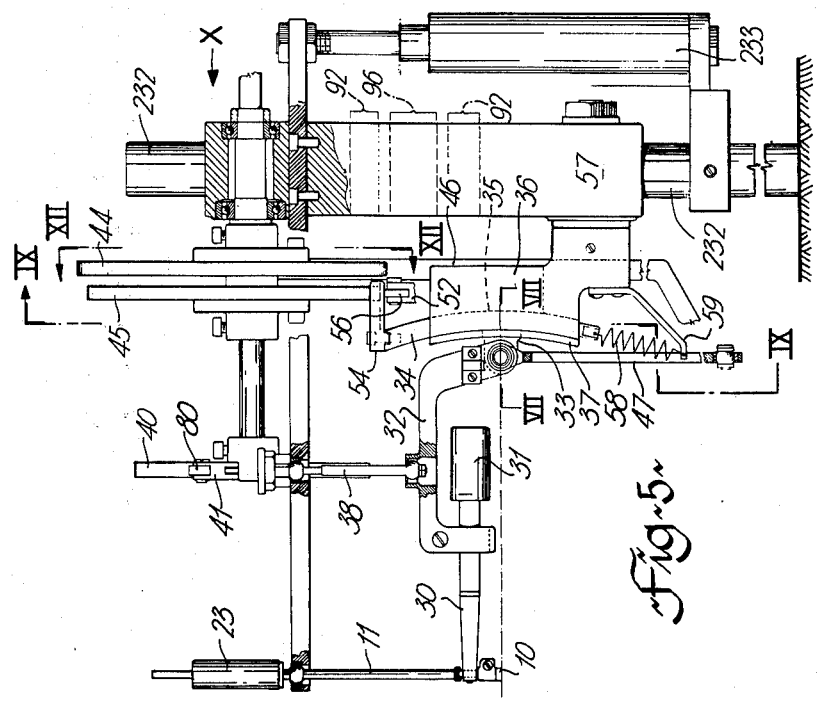
Fig-5-
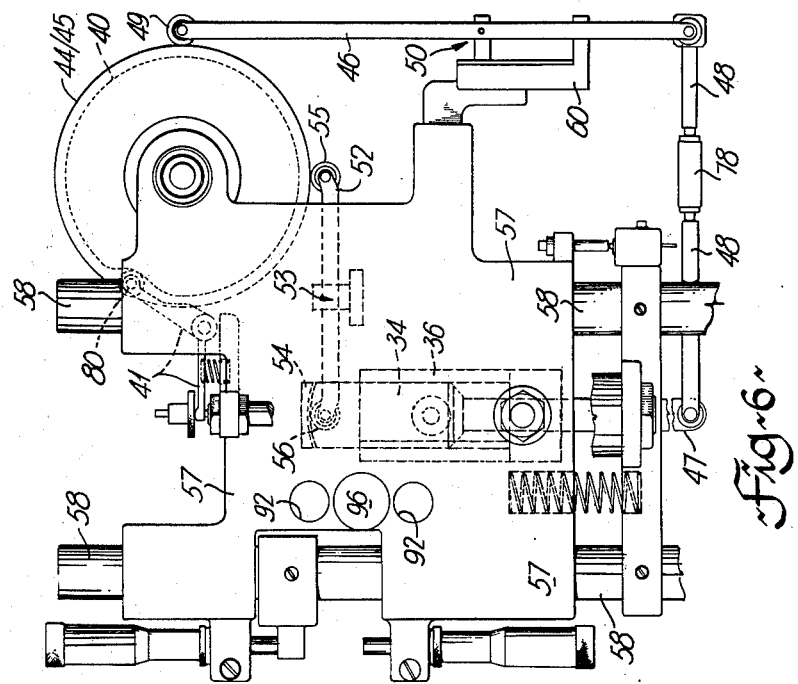
Fig-6-

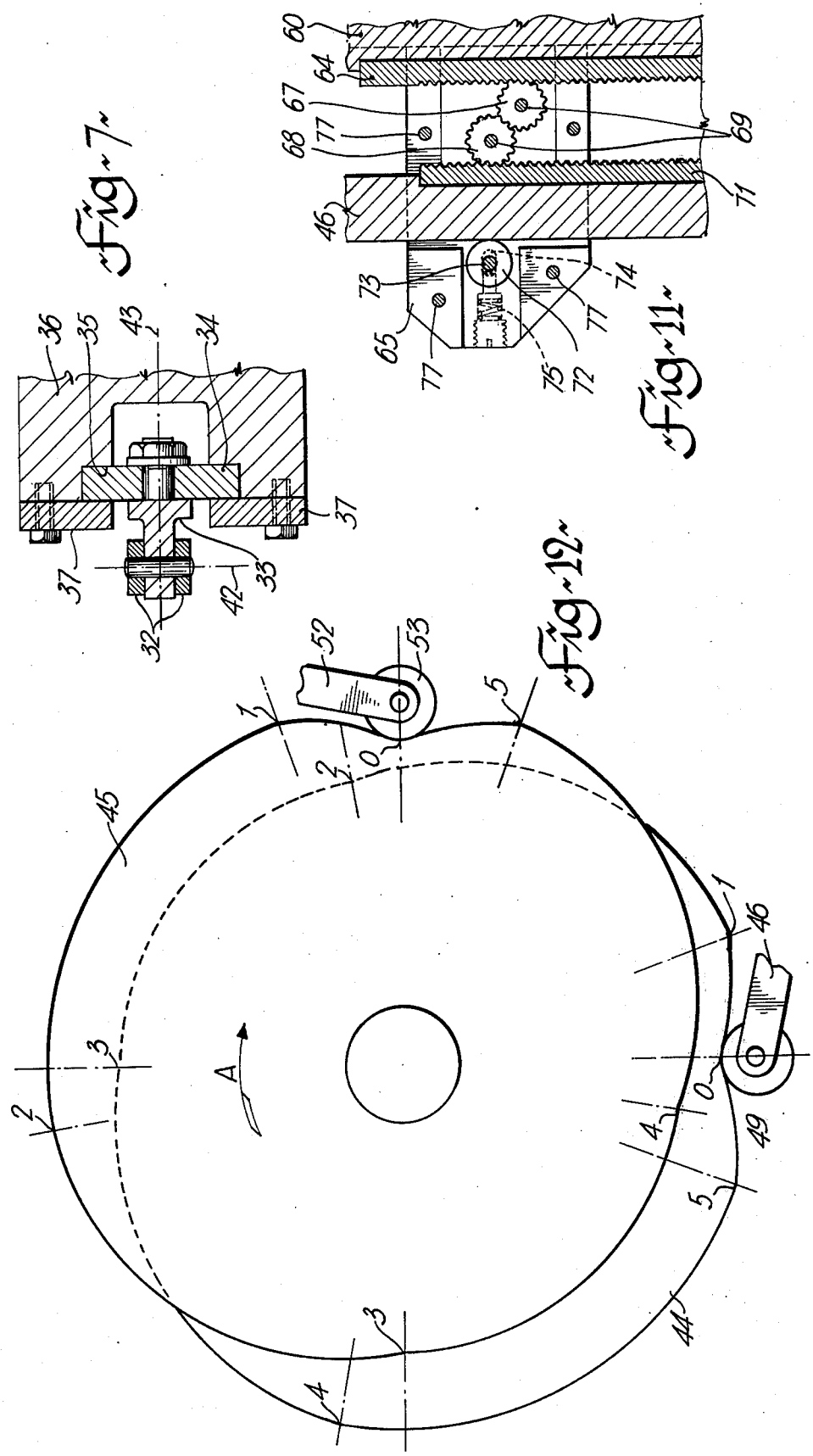

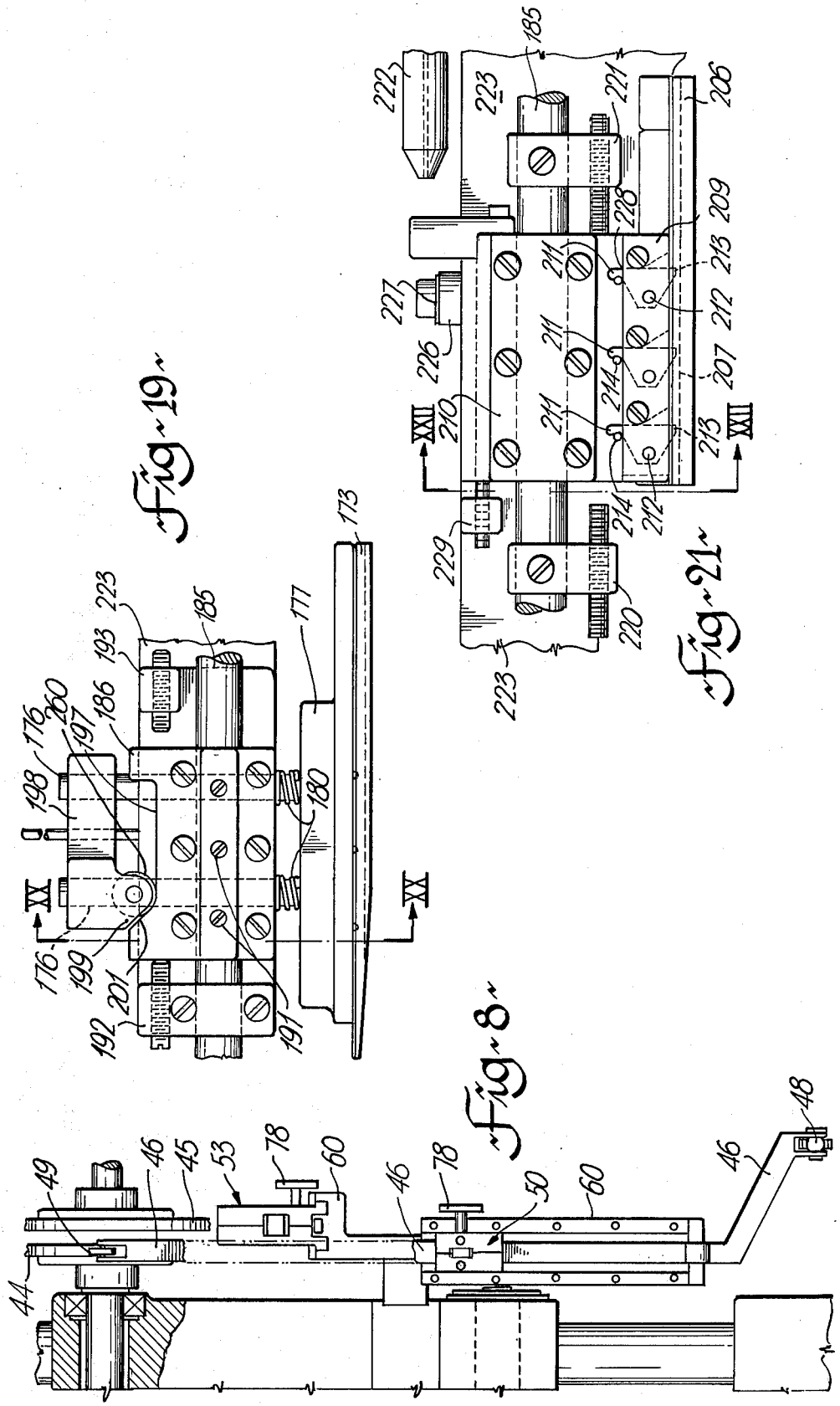

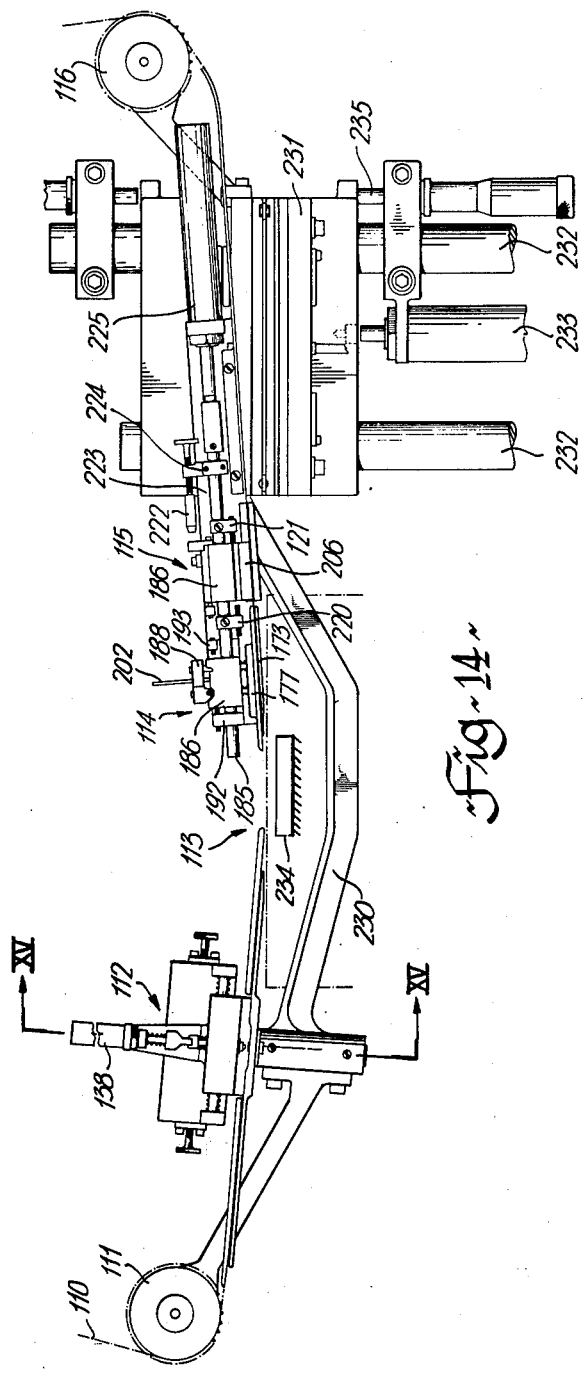

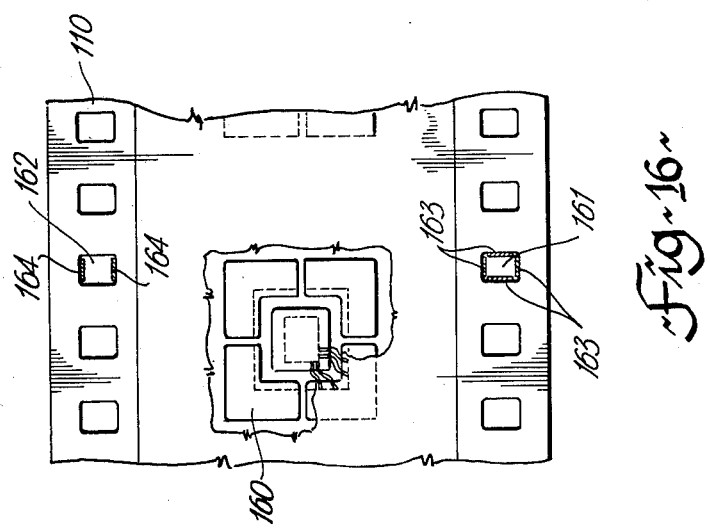
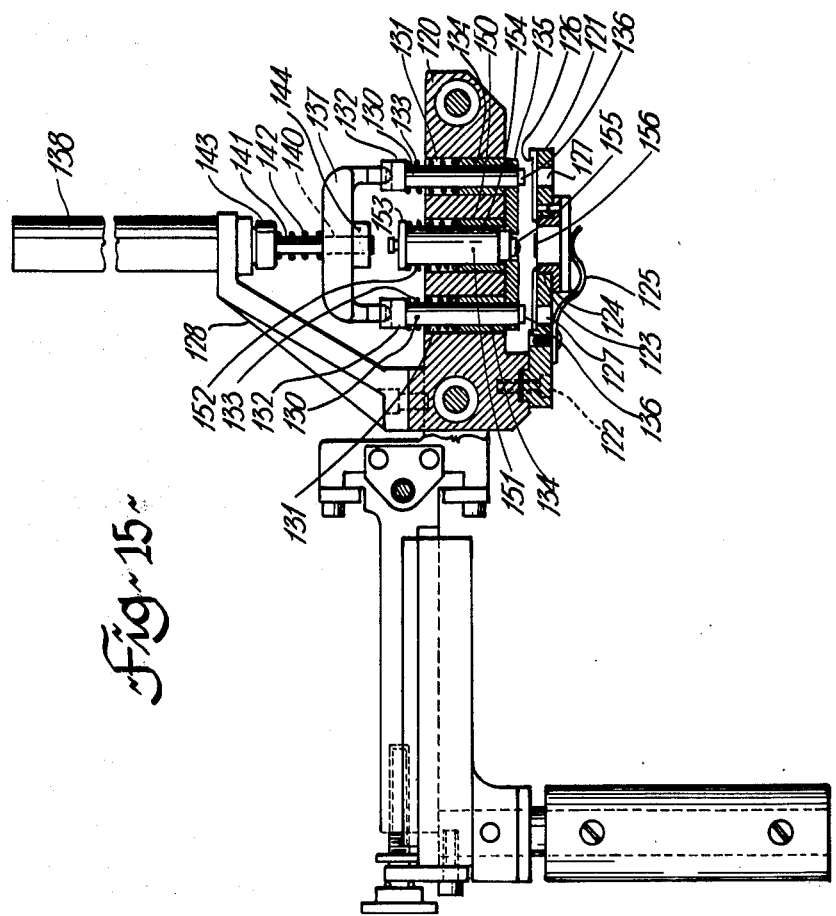

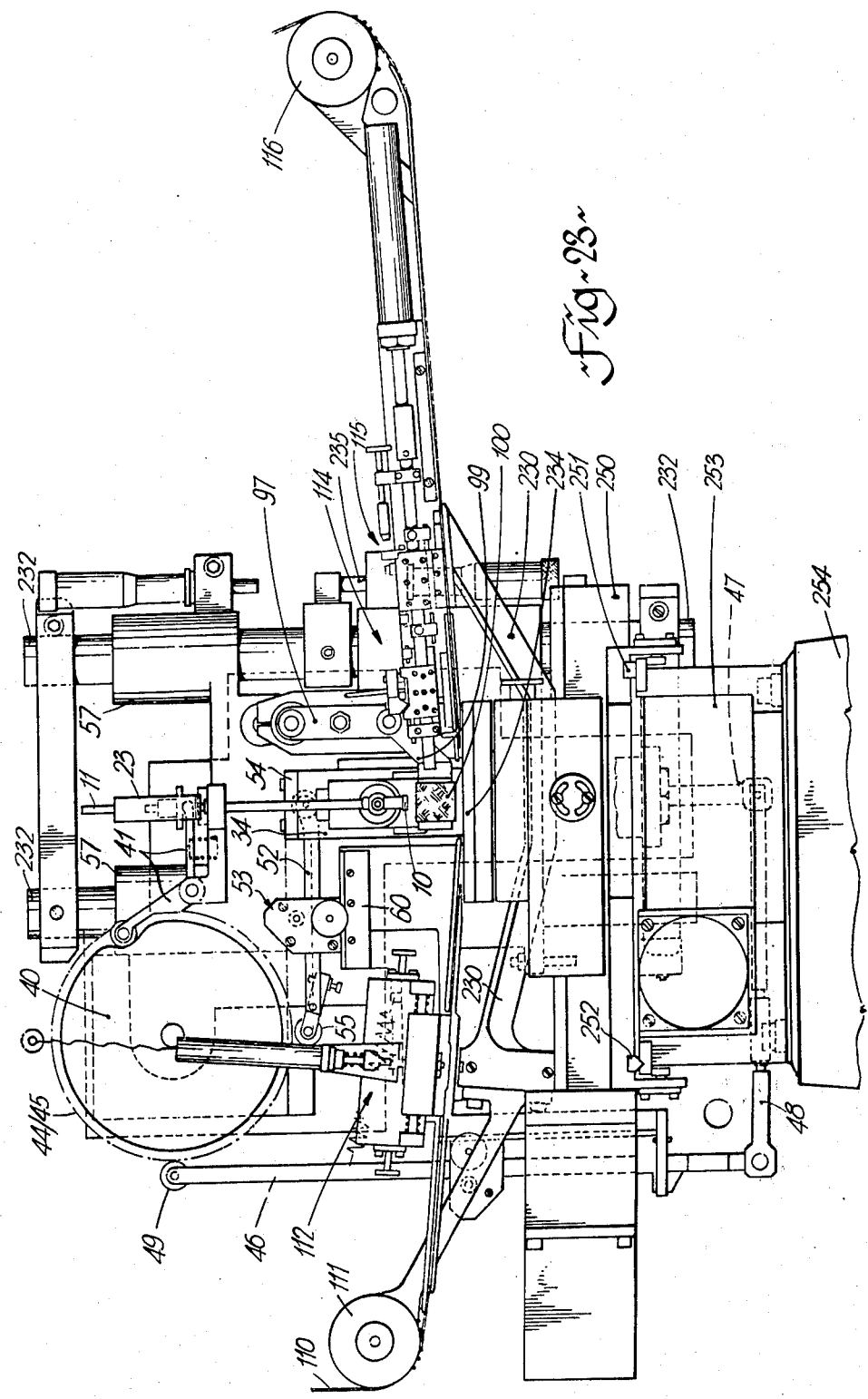

APPARATUS FOR BONDING WIRE LEADS

This invention relates to apparatus for bonding wire leads, and in particular for ultrasonically bonding leads of lead frames to contacts on a die or chip, for semiconductor devices.

It is known to ultrasonically bond leads to contacts using a bonding head which is moved or "wobbled" so that a contact point on the periphery of the bonding head progressively moves round the periphery, successively acting on, and bonding, each of a plurality of leads extending inwardly from a lead frame towards a die or chip, for example an integrated circuit device. This process is conveniently referred to as "wobble-bonding".

A present form of apparatus supports the bonding tool in a frame which is pivotally attached to the main part of the apparatus. The weight which is applied to the bonding head is applied directly via a part of the support frame. The method of mounting the tool does not provide clear access to the tool to permit a continuous feed of etched frame film or other forms of continuous lengths of frames, and the table space beneath the tool is restricted.

The present invention provides an apparatus in which the bonding tool is solidly attached to a support member which is mounted on double axis pivot, or trunnion, with the pivot or trunnion mounted on a sector bearing. The interception of the two axes is on a centre common with the active surface of the bonding tool, which surface is convex. The weight is applied directly over the tool. The working surface is left completely clear of any apparatus parts and enables an automatic continuous feed of frames to be used, if desired.

The invention will be readily understood by the following description of certain embodiments of the invention, in conjunction with the accompanying drawings, in which:

FIGS. 1 and 2 are diagrammatic views illustrating the basic features of the apparatus, FIG. 2 being a cross-section on the line II—II of FIG. 1;

FIG. 3 is an enlarged view of the bonding surface of the bonding tool, illustrating the relationship thereof with the pivotal axes of the apparatus;

FIG. 4 is a diagram of the progression of the contact position of the bonding surface;

FIG. 5 is a side view of the apparatus, partly diagrammatic;

FIG. 6 is a view in the direction of arrow X in FIG. 5, part of the support structure deleted for clarity;

FIG. 7 is a cross-section on the line VII—VII of FIG. 5;

FIG. 8 is a side view, in the direction of the arrow Y in FIG. 6, illustrating the tool actuating cams and levers in more detail;

FIG. 11 is a cross-section on the line XI—XI of FIG. 10;

FIG. 12 is a view of the cams as on a line XII—XII of FIG. 5;

FIG. 14 is a side view of a preforming apparatus, together with positioning and feed positions;

FIG. 15 is a cross-section through the preform head on the line XV—XV of FIG. 14;

FIG. 16 is a plan view of a length of film carrying lead frames;

FIG. 19 is a side view of the positioning or alignment head to a larger scale;

FIG. 21 is a side view of the feed mechanism to a larger scale;

FIG. 23 is a front view of one form of complete apparatus.

Figures 9, 10:
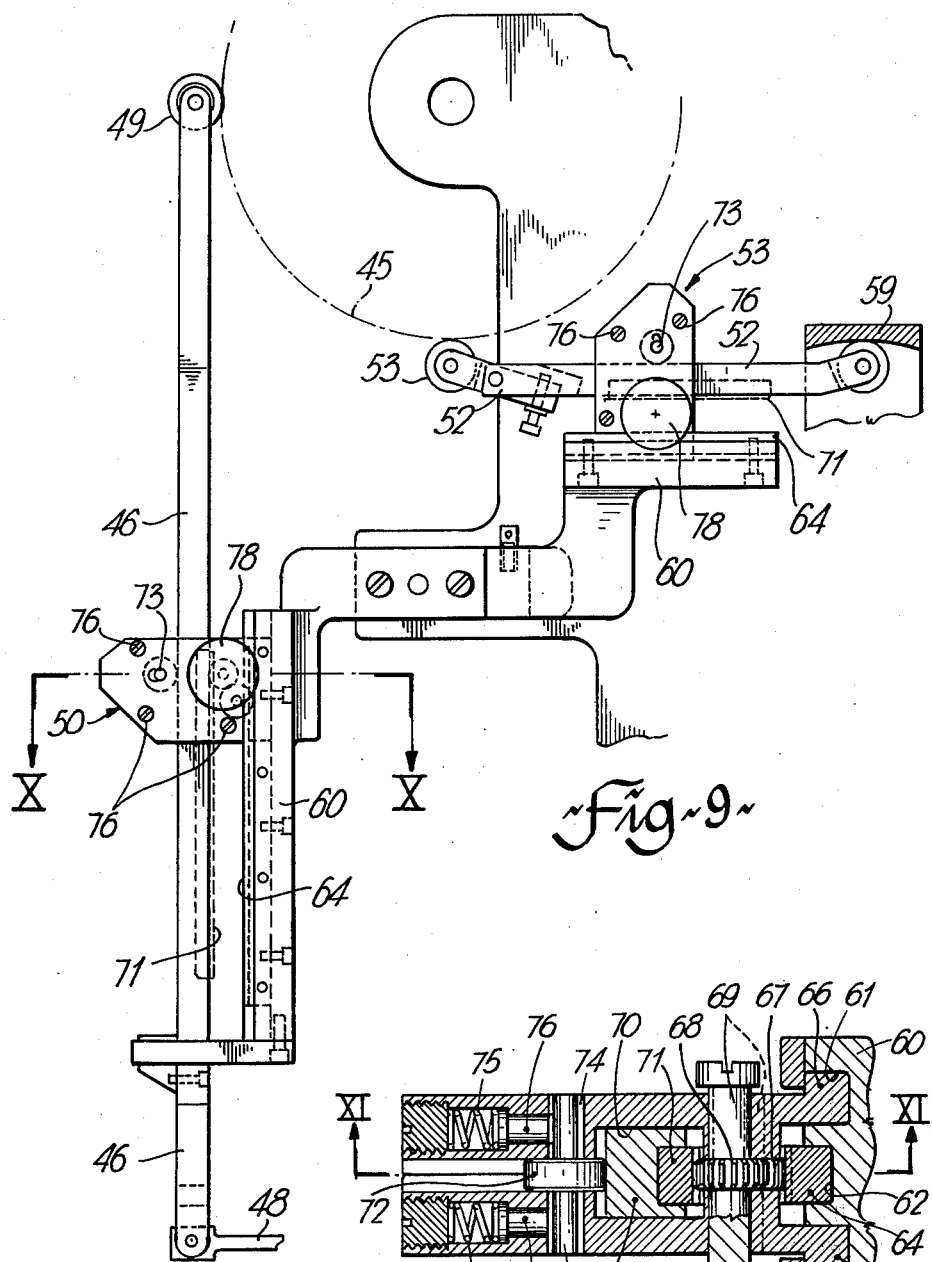
FIG. 9 is a cross-section on the line IX—IX of FIG. 5, illustrating the cams, levers and pivotal point adjusting mechanism.
FIG. 10 is a cross-section on the line X—X of FIG. 9.

As illustrated in FIGS. 1 and 2, a bonding tool 10, at the base of a member 11 is held in a support member or arm 12. Member 12 is cranked or bent down at its end remote from the tool 10 and is also divided to form a fork 13. The fork 13 encompasses a spigot 14, the fork being pivotally mounted on the spigot 14 to rotate as indicated by arrows 15. The spigot 14 is itself pivotally mounted in a slider member 16 for rotation as indicated by arrows 17. The axes of rotation of the fork 13 on the spigot 14 and the spigot 14 in the slider member 16 are coincidental and are also in a plane 18 which is tangential to the bonding surface 19 of the tool 10 — seen more clearly in FIG. 3.

The slider member 16 slides along an arcuate surface 20 of a bearing member 21, as indicated by arrows 22. The axis of the arcuate surface 20 is on the plane 18 and is at the interception of this plane with the bonding surface 19 of the tool 10.

The tool is brought into the operating position by rotating the arm 12 on the spigot to lower the tool 10, to a central position — 0 in FIG. 4. By simultaneously moving the slider 16 up and rotating the spigot 14 — counterclockwise in FIG. 2 — the contact position moves to 1 in FIG. 4. The spigot 14 is then rotated — clockwise in FIG. 2 — to move the contact position to 2 in FIG. 4. Movement of the slider 16 down moves the contact position to 3 in FIG. 4, then rotation of the spigot 14 outerclockwise (in FIG. 4) moves the contact position to 4, and finally upward movement of the slider 16 moves the contact position to 5 in FIG. 4, which coincides with 1. The tool is lifted and slider and spigot return to a central position. The movement of the contact position from 1 to 5 in FIG. 4 is continuous and there is contact at all times. As a lead is passed over by the tool it is bonded to a contact area beneath it on a die or chip. Ultrasonic vibration is applied to the head, and weight is applied at 23.

The above description only described the basic features of the invention. The movement of the arm 12, spigot 14 and slider 16 can be obtained in a variety of ways. Also it is likely to be desired to vary the amount of movement. A more specific example of one form of apparatus is illustrated in FIGS. 5 to 12 as an example.

As illustrated in FIG. 5, the bonding tool or head 10 is at the lower end of member 11 with a weight 23 on the upper end of member 11 as in FIG. 1. The arm 12, of FIG. 1, is indicated by horn 30 carrying a coil 31 which provides supersonic vibration to the horn 30. The horn 30 is rigidly mounted at one end of a fork member 32. At its other end the fork member 32 pivotally attached to spigot 33, which corresponds to spigot 14 of FIG. 1. Spigot 33 is pivotally mounted on arcuate slider 34 which slides in an arcuate channel 35 in a main support member 36, and retained in the channel by cap members 37. The channel 35, slider 34 and cap members 37 are seen in FIG. 7 which is a cross section through the channel.

The fork member 32 is pivotally supported at a position intermediate its ends by a lift member 38. Lift member 38 is used to lift the fork member 32, with the horn 30 and tool 10, to raise the tool clear of workpieces between bonding operations. Lift member 38 is actuated by a cam 40 and pivoted lever 41. When the lift member lowers the fork member, horn and tool, the fork member is effectively disengaged in that the fork member is completely free to pivot on the spigot 33 about an axis which is coincidental with the bonding face of the tool 10, the axis indicated at 42, (FIG. 7) and is also completely free to pivot about a further axis, also coincident with the bonding surface of the tool 10 and normal to the axis 42, indicated at 43 (FIG. 7).

The two pivotal movements are obtained from two cams 44 and 45. Cam 44 actuates a pivotal lever 46 which in turn actuates lever 47 through a third lever 48. Lever 47 is actuated at its lower end by the lever 48 and at its upper end lever 47 is attached to the spigot 33. Thus radial movement of the follower 49 on cam 44 pivots lever 46 about its pivotal mounting position 50, moves lever 48 laterally and moves the lower end of lever 47. This is the movement indicated by the arrows 17 in FIG. 2.

Cam 45 actuates a lever 52 which is pivotally supported at a position 53 intermediate its ends. The cam 45 acts on one end of lever 52, and the other end of lever 52 engages with a projection 54 on the top of the slider 34. This movement of the one end of the lever 52 by the cam 45 produces up down sliding movement of the slider 34. This produces a pivoting of the fork lever 32 on the spigot 33, and about a pivot point on the bonding face of the tool 10. The combined movements to produce this latter pivoting are those indicated by arrows 15 and 22 in FIG. 1. Rollers 55 and 56 are provided at each end of the lever 52.

The slider 34 is spring biased downwardly by tension spring 58 connected between the lower end of the slider and a bracket 54 attached to the support member 36.

The entire mechanism is mounted on a main frame member 57 which in turn is mounted for vertical movement on columns 232. The frame member 57 can be moved up and down by a pneumatic ram assembly 233. This is seen in FIG. 5.

The pivotal positions of the levers 46 and 52 can be made variable to provide for variation in the amount of movement applied to the tool. FIGS. 8 and 9 illustrate a particular form of adjustable pivotal point for each lever. Thus for lever 46 a variable pivot mechanism is provided at position 50 and for lever 52 a similar variable pivot mechanism is provided at position 53. The actual form of the variable pivot mechanisms are essentially the same, comprising opposed racks with which engage two pinions, the pinions themselves in mesh with each other.

FIGS. 10 and 11 illustrate in more detail one of the variable pivot mechanisms, as an example the mechanism at position 50, the mechanism being shown in cross-section. The support structure 60 has three grooves 61, 62 and 63 therein. In the central groove 62 is fastened a rack 64. In the outer grooves 61 and 63 are positioned support brackets 65 and 66, a bracket slidable in each groove. The brackets cooperate to rotatably support two pinions 67 and 68, the pinions supported on shafts 69 carried in the support brackets 65 and 66. The pinions 67 and 68 meshes with the rack 64.

The brackets are recessed, at 70 to provide an enclosure around the lever 46. Lever 46 is slidable in the recesses in the brackets and carries a further rack 71, with which the pinion 68 meshes. The lever 46 is spring loaded towards the pinions 67 and 68 by a roller 72 mounted on a shaft 73 supported in elongated holes 74 in the brackets 65 and 66. Springs 75 act upon plungers 76 which in turn act on the shaft 73. The roller 72 and pinions 67 and 68 are positioned in recesses formed in the brackets 65 and 66. The two brackets are held together by screws indicated at 77. A knob 78 is attached to one end of the shaft 69 carrying pinion 68.

By rotating the knob 78, pinion 68 is rotated, which in turn rotates pinion 67 — the pinions rotate in opposite directions. This rotation of the pinions moves the brackets in one direction or the other depending upon the direction of rotation of the knob. Thus, in the example described, for shaft 46, and considering FIGS. 9, 10 and 11, turning knob 78 clockwise (FIG. 9) would rotate pinion 68 clockwise and pinion 67 outerclockwise — and this would move the brackets 65, 66 downward. The lever 46 actually pivots on the pinion 68 and movement of the brackets downward also moves pinion 68 downward and therefor moves the pivotal point of lever 46 downward. Downward movement of the pivot point varies the relationship between the two parts of lever 46 — on either side of the pivot point, and in this particular example reduces the movement of lever 48. The length of lever 48 can be adjusted by a turnbuckle 78.

The mechanism at pivot position 53 for lever 52 is identical in form, but as lever 52 is shorter, shorter racks are provided. The same reference numerals are applied. In the mechanism at position 53, clockwise rotation of the knob 78 moves the brackets to the right, in FIG. 9. This would reduce the movement of the arcuate slider 34.

The cams 44 and 45 are illustrated diagrammatically in FIG. 6. The forms of the cams are seen more clearly in FIG. 12, the cams positioned and outlined as looked at from the front of the apparatus. The configuration of the cams should be considered in conjunction with FIG. 4. FIG. 4 is effectively a plan view of the movement of the contact position on the surface 19 of the tool 10, standing in front of the apparatus and looking down.

Starting with the contact position at the centre of the tool — position 0 in FIG. 4, the cam followers 49 and 53 — for levers 46 and 52 respectively, are at positions 0 on cams 44 and 45 respectively. The cams rotate clockwise, as viewed from the front and as indicated by the arrow A. The first rotational movement of the cams 44 and 45 lifts follower 49, which via levers 46, 47 and 48 rotates the spigot 33 outerclockwise, and simultaneously via follower 53 and lever 52 moves the arcuate slider member 34 upwards. This moves the contact position on the tool 10 both sideways and forwards to position 1 and the followers will be at positions 1 on the cams 44 and 45.

Continued rotation of the cams maintains follower 53 at a constant radius with no movement of lever 52 or of slider 34. Follower 49 moves inwards which results in a clockwise rotation of the spigot 33. This moves the contact position from 1 to 2 in FIG. 4 and the followers are then at positions 2 on the cams. Further rotation of the cams from positions 2 maintains follower 49 at a constant radius, with no movement of lever 46 and thus no rotation of the spigot 33. Follower 53 moves inwards - moving lever 52 and moves the slider 34 down with the contact position on the tool moving to position 3, in FIG. 4, the followers at positions 3 on the cams.

Rotation of the cams continues with the follower 53 now remaining at a constant radius and no movement of the slider 34, while follower 49 moves outwards resulting in outerclockwise rotation of the spigot 33. The contact position on the tool moves to 4 in FIG. 4 and the followers are at positions 4 on the cams. Then, on the next rotational movement of the cams 44 and 45 the follower 49 remains at a constant radius, with no rotation of the spigot 33, and follower 53 moves outwards moving the slider 34 upwards. This moves the contact position on the tool to 5 in FIG. 4 and the followers are at positions 5 on the cams.

Finally with the cams coming to a full revolution followers 49 and 53 move inwards rotating the spigot clockwise and the slider down to finish with the contact position on the tool at 0 and the followers also at 0 on the cams.

The rotation of the cams 44 and 45 is continuous - and quite slow, and the contact position actually traces a path as in FIG. 4. The ultrasonic generator 23 is operating all the time tool contact position moves from position 1 round to position 5 and bonds any leads it passes over.

As previously described the tool is lifted out of engagement by means of cam 40 and lever 41. As seen in FIG. 6 the follower 80 for lever 41 is resting on the minimum radius portion of the cam 40 and this will have lifted the tool up. This will correspond to the position 0 in FIG. 4 and positions 0 on cams 44 and 45. As the cams 44 and 45 rotate to move the contact position from 0 to 1 cam 40 also rotates, lifting follower 80 and allowing the tool to move down. Contact between tool and workpiece does not actually occur until just prior to position 1. The tool remains down during the following rotation of cams 44 and 45 and cam 40 until position 5 is reached. Further rotation of all the cams results in the follower 80 moving inwards, lifting the tool. Thus actual contact finishes just after position 5.

The actuation of the apparatus can be cycle by cycle, each cycle being initiated by an operator. Between cycles, the tool being lifted, the lead frame and die which have been bonded is removed and a new lead frame and a new die placed in position. Alternatively the actuation can be made automatic, with continuous supply of lead frames and dies in sequence to the bonding position. An example of a preforming, aligning and feeding apparatus is described in our co-pending application serial number.

Conveniently, for automated bonding, the lead frames are prepared in long strips and fed one by one beneath the bonding head, as described in the above referred application. The dies, or chips, are carried on a substrate or support by being attached to the surface of the support by, for example, wax. Hot air is circulated through the bonding tool — or it is heated by some other means such as electrically — and as the leads are bonded to the die the die is warmed to a temperature sufficient to soften the wax. By the time bonding is complete, the wax is sufficiently softened to permit the die to be lifted free of the support as the lead frame is fed from beneath the bonding tool.

The dies are mounted on the support in a predetermined pattern which enables the dies to be positioned sequentially beneath the bonding tool by moving the support through a predetermined path. For example they can be arranged in lines across the support which can then be indexed across in straight lines, being moved laterally by the space of one line after a line of dies has been bonded to leads. Another arrangement is to position the dies in a series of concentric circles, the support rotating under the tool to present the dies in sequence. After one circle has been bonded the support is moved to position the next circle for passing under the bonding tool.

To check that dies are correctly positioned, a binocularscope or other similar device, not shown, can be positioned adjacent the apparatus for looking at the die, as it is in the bonding position. As it is very difficult, at the least, to position the viewing device so that the dies can be seen, without interfering with the operation of the apparatus, a prism is mounted on the apparatus, the prism withdrawn when the tool is in operation, but being capable of being moved to a position above a die when the bonding tool is lifted up, as by the cam 40. The viewing device is then positioned to be aimed at the prism and thus the die can readily be seen. Means are provided on the mounting for the support carrying the dies for moving the support along two axes and also for rotating the support.

Figure 13:
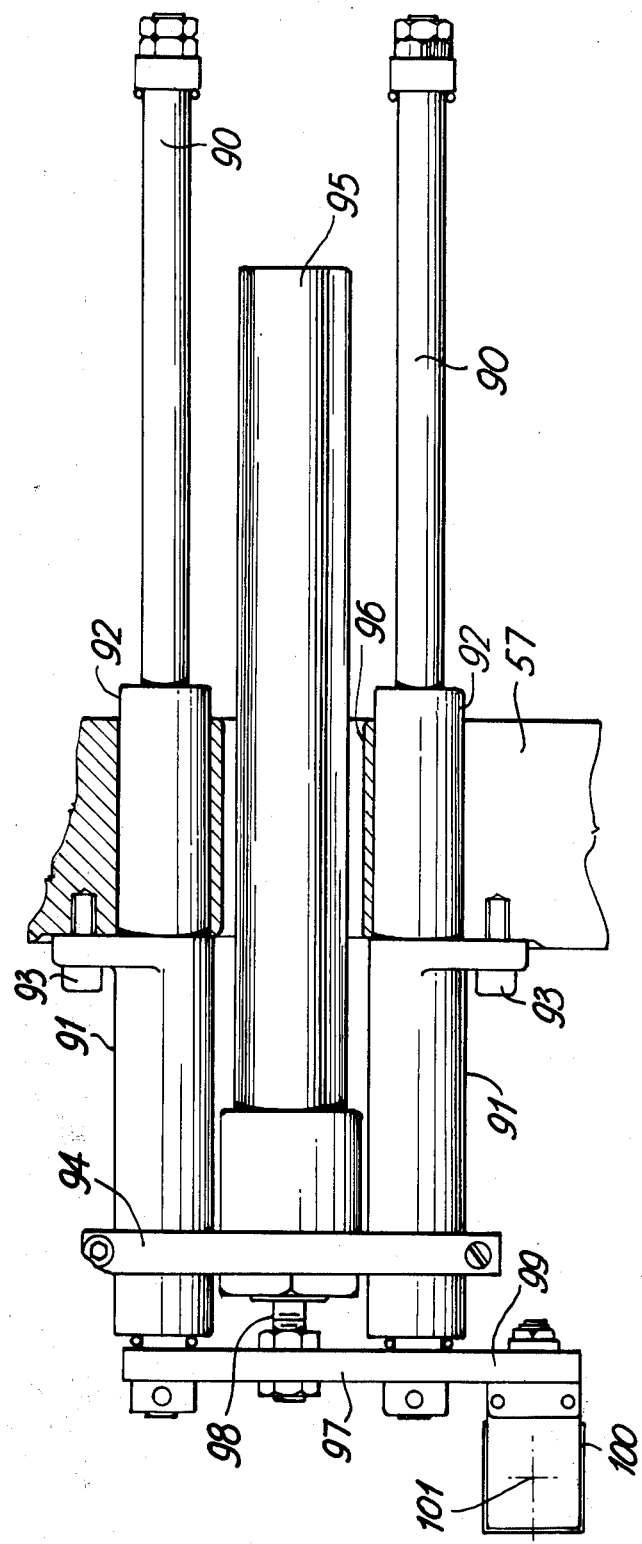
FIG. 13 is a side view of a prism mounting system.

The prism is illustrated particularly in FIG. 13 and seen also in FIG. 23. The prism is mounted on two slides 90. Slides 90 are supported in bushes 91 extending through bores 92 in the frame member 57 and extending from the front face of the frame member. The bushes are attached to the frame member by screws 93 and are connected at their outer ends by a bridging member 94. Attached to the bridging member 94 is the cylinder of a pneumatic ram 95, the cylinder extending rearwards through a further bore 96 in the frame member 57. The bores 92 and 96 are seen in FIG. 6.

The forward ends of the slides 90 are connected by a cranked lever 97, to which is also attached the forward end of piston rod 98 of the pneumatic ram 95. The lever 97 extends downwardly and sideways at 99 and carries at its lower end a prism 100.

When the sonic welding head is in the operative position — that is with the frame member in its downward position — the prism is in its withdrawn position, as in FIG. 13. When the frame member 57 is raised by the pneumatic ram 95, the prism 99 is moved forward by the pneumatic ram 95. When in the forward position, the central axis of the prism — indicated at 101 — is exactly below the centre of the bonding tool 10. A binocular — not shown — also sights on the prism and the viewer sees the die positioned beneath the prism, the lead frame above the die, and also the bonding tool optically superposed thereon. It is possible to vary the position of the lead frame to ensure that it is aligned with the die.

The bonding apparatus is particularly suitable for use in conjunction with alternative preforming of leads and alignment of the lead frames carrying the leads to ensure accurate bonding of the leads to contact pads on the die. Such an apparatus is described in copending application Ser. No. 729485 filed Oct. 4, 1976 in the name of the present assignees.

The preforming and alignment apparatus provides for successively and continuously feeding frames preassembled into long strips, through a preforming position and then to a bonding position, automatically. At the bonding position the frames are aligned in succession with dies, a plurality of dies having been assembled onto a supporting substrate. Perforations in the strips of frames are used to preposition the frames prior to preforming and prior to bonding. By using the same perforations in the masking and etching of the frames a high degree of positional accuracy can be obtained. The frame strip is allowed to float at the positioning stages to ensure correct alignment. The periphery and aligning apparatus will now be described in more detail.

As illustrated generally in FIGS. 14 and 15, a film 110 carrying lead frames is fed via a toothed pully 111 into a preform apparatus indicated at 112. In the apparatus 112 the film is located accurately, as will be described, using perforations in the film. After preforming, the film is fed to a bonding station, which is at 113, where, for example, the preformed leads are supersonically bonded or welded to the related contact areas on the lead frame by a bonding machine as described and illustrated in copending application no.

To ensure the extremely close alignment necessary between die and lead frame, the film carrying the lead frames is located by a locating head 114 positioned close to the bonding position. Feed mechanism 115 provides step by step feed of the film, which finally issues from the assembly and passes over toothed pully 116. The bonded lead frames and dies are wound up on a spool, the successive turns separated by a separator strip to avoid damage.

For automatic bonding of dies to lead frames, extreme accuracy is required. For example the location of the beams or wires of the frame in relation to the bonding pads on the die cannot vary more than 0.005 inches as certain manufacturing tolerances must be provided for in the form of the lead frame and the die pattern. If locating accuracy of more than 0.005 inches is allowed then it is possible that insufficient overlap of lead and associated bonding pad occurs.

Firstly, considering the preforming of the leads, the preform apparatus 112 is seen in transverse cross section in FIG. 15. The apparatus comprises a main support member 120 underneath which is positioned a support table 121. Support table 121 is attached to the support member 120 at the rear, by screws 122 and is spaced a short distance below the bottom surface of the support member. A central aperture 123 holds a platform 124 which is held in the aperture 123 by a leaf spring 125. In operation the film 110 passes over the table 121 and the top surface of the table is recessed slightly at 126 to give some location to the film. Two further apertures 127 coincide with the position of the rows of perforations along each side of the film.

Supported above the support member 120, by means of a bracket 128, is a locating and preforming device. This comprises two plungers 130 spaced apart the distance between the two rows of perforations in the film. Each plunger 130 is mounted in a bore 131 in the support member for axial movement. The upper end of each plunger is enlarged — at 132,— and a compression spring 133 surrounds the upper part of each plunger, one end of the spring abutting against the enlargement 132 and the other end resting on the end of a bush 134 in the bore 131. The springs 133 bias the plungers upwards.

The lower ends of the plungers 130 extend slightly from the bottom of the support member 120 and are connected by a yoke 135. The extreme lower ends 136 of the plungers 130 are reduced in dimension to fit into the perforation of the film, as will be described in more detail. The upper ends of the plungers 130 are acted upon by a further yoke 137 which in turn is, in the present example, acted upon by a hydraulic cylinder and piston assembly 138.

There is a central bore 140 in the yoke 137 through which passes the piston rod 141 of the cylinder and piston assembly 138. A compression spring 142 is situated between the yoke 137 and an enlargement 143 on the piston rod 141. The lower end of the piston rod has a collar 144 attached thereto.

There is also a central bore 150 in the support member 120 and a further plunger 151 slides axially therein. A compression spring 152 extends between an enlargement 153 at the top end of the plunger 151 and a bush 154 in the central bore 150 to bias plunger 151 upwards. There is a clearance between the top of the plunger 151 and the lower end of the piston rod 141. The lower end of the plunger 151 is shaped to form a preforming head 155.

In operation, with a film carrying lead frames positioned in the apparatus, initial actuation of the cylinder and piston assembly 138 moves piston rod 141 downwards which in turn causes the yoke 137 to be pushed down by compression spring 142. Downward movement of the yoke 137 pushes the plungers 130 downwards and the lower ends 136 into a perforation in each row of the film perforations. The film is free to move both forwards or backwards — relative to the feed direction, and also sideways. It is arranged that the lower end 136 of one of the plungers locates on all four edges of the related perforation, while the lower end 136 of the other plunger locates only on two opposite edges of its related perforation.

Considering FIG. 16, which is a plan view of a length of film 110 with lead frames 160 therein, there are indicated two perforations 161 and 162, one in each row of perforations. For perforation 161 the related end 136 of the plunger 130 registers or locates on all four sides of the aperture, as indicated by the thick lines 163. For perforation 162, the related end 136 registers or locates on only two sides — in the example as indicated by the thick lines 164. The locating at 163 provides location of the film in both X and Y axes, and the locating at 164 provides rotational alignment. By this means the film, and the lead frame, in the preforming apparatus is correctly positioned.

Following this alignment, which occurs on the initial movement of the piston rod 141, continued downward movement of the piston rod 141 takes up the clearance between the lower end of the piston rod and the upper end of the plunger 151 which is then pushed downwards. The lower end of preforming head 155 moves into contact with the ends of the beam leads and pushes them into a die 156 to preform them. The piston rod then withdraws upwards, the central plunger 151 moving upwards under the action of spring 152 and then the yoke 137 and plunger 130 move upward.

Figure 17:
FIG. 17 is a cross-section showing the leads before preforming.
Figure 18:
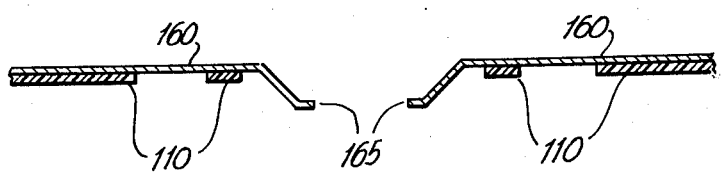
FIG. 18 is a similar cross-section to that of FIG. 17, but showing the leads after preforming.

FIGS. 17 and 18 are cross sections through a lead frame and film, before and after preforming respectively. The film is indicated at 110, the lead frame at 160 and the leads at 165. The film and the associated lead frame is depressed slightly when the locating ends of the plungers 130 enter the perforations. When the locating plungers and preforming plunger lift out of engagement, the film lifts slightly also, and this lifts the preformed ends of the leads 165 out of the die 156 to permit forward feeding of the film without interference between leads and die. By such preforming it is assured that the ends of all the leads are substantially in the same plane prior to bonding.

From the preforming station, or apparatus the film and associated lead frames progresses to the bonding stage, indicated at 113 in FIG. 14. The form of bonding apparatus is as described above with reference to FIGS. 1 to 13.

The film, with lead frames, is fed stepwise by a feed mechanism, indicated at 115 in FIG. 14, through an alignment apparatus indicated at 114 in FIG. 14. The alignment apparatus 114 is positioned as close as possible to the bonding stage to provide the highest degree of accuracy.

Figure 20:
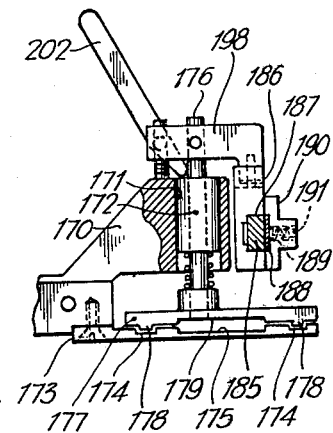
FIG. 20 is a cross-section through a positioning head on the line XX—XX of FIG. 19.

The locating or alignment apparatus 114 is seen in more detail in FIGS. 19 and 20. It comprises a support bracket 170 having two vertical bores 171 having bushes 172. From the bottom of the support bracket extends a support table 173. The table has two recesses 174 in its upper surface spaced apart the distance between the rows of perforations in the film. A central recess 175 extending right across the table provides clearance for the semiconductor chip or die which has been bonded to the leads of the lead frame.

Passing through the bushes 172 are rods 176 carrying a locating member 177 at its lower end. The bottom surface of the locating member 177 has two projections 178 opposite the recesses 174 in the support table 173. There is also a central recess 179 extending across the bottom surface of the locating member to provide clearance. The projections 178 act in a similar manner as the lower ends 136 of plungers 130 of the preform apparatus 112. One projection 178, for example the front one — on the right in FIG. 20 — engages with a perforation in one row in the film on all four sides of the perforation. This gives X and Y axes location. The other projection 178 engages only with two opposite sides of a perforation in the other row and ensures that the film is also correctly orientated.

The locating member 177 is urged downward by compression springs 180 and the locating member is thus biased downwards in contact with the support table 173.

The apparatus is actuated by the lateral movement of a sliding bar 185. In the locating apparatus 114 the bar 185 supports a block 186. The block has a recess 187 in which the bar 185 can slide and a friction member 188 is held in engagement with the bar by means of springs 189 in a cap 190. The springs are positioned in threaded holes in the cap 190, being backed up by set screws 191. The set screws enable the spring force, and thus the friction between the friction member 188 and bar 185, to be adjusted.

The support bracket 170 also carries two stops 192 and 193 which limit lateral movement of the block 186. Stop 192 also provides a sliding bearing for the bar 185. In the top surface of the block 186 is a recess 197 having one end inclined, the left hand end in FIG. 19. Attached to the upper ends of the rods 176 is a bracket 198 which has a projection 199 projecting downwards into the recess 197. The projection carries a roller 200 and lateral movement of the bar 185 and block 186 — to the right in FIG. 19 — causes the roller to move up the inclined end — indicated at 201 — of the recess 197. This lifts the rods 176 and the locating member 177 against the springs 180. The projections 178 are freed from the film perforations and enables the film to be fed forward. A small lever 202 is provided for manual lifting of the locating member, the lever pivotally mounted on the support bracket 170 and engaging under the bracket 198.

Actuation of the locating or alignment apparatus will be further described in conjunction with the feed apparatus 115. As with the preforming apparatus 112, the film in the locating or alignment apparatus 114 is free to move so that it is exactly aligned, or positioned by the projection 178, on the locating member 177.

Figure 22:
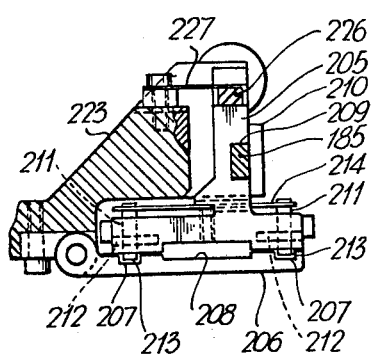
FIG. 22 is a cross-section at the entry end of the feed mechanism, on the line XXII—XXII of FIG. 21.

The feed mechanism 115 is seen in more detail in FIGS. 21 and 22. The feed mechanism comprises a feed member 205, beneath which extends a support table 206. Table 206 has two parallel grooves 207 which coincide with the perforations in the film and also a central recess 208, which extends for the whole table, providing clearance for the semiconductor chip or die. The feed member 205 is mounted on the bar 185, the bar sitting in a recess 209 and retained by a cover 210.

At the lower end of the feed member are two rows of fingers 211. The fingers are pivotted on pins 212. The lower ends 213 of the fingers extend down to engage in the recess 207 in the support table 206. At their upper ends the fingers bear against spring wires 214.

Attached to the bar 185, on either side of the feed member 205, are two stop members 220 and 221 and a further stop member 222 is mounted on the main support structure 223, an extension of which forms the support bracket 170 (FIGS. 19 and 20) of the locating apparatus 114. The stop member 222 also provides a support bearing 224 (FIG. 14) for the bar 185. Attached to the end of the bar 185, in the present example, is a pneumatic ram 225 (FIG. 14).

The operation of the locating or alignment apparatus and the feed apparatus is as follows. At the beginning of a feed operation, the ram 225 is extended and the bar 185 is in the position as in FIG. 14, and also FIGS. 19 and 21. The locating member is locating the film and the block 186 is against the stop 192. The feed mechanism is in engagement with perforations in the film via the lower ends 213 of the fingers 211 and is in contact with stop 221.

On initial movement of the ram — to the right in FIGS. 14, 19 and 21, the feed mechanism remains stationary, held by a friction member 226 supported by a spring 227 from the main support structure 223. The block 186 of the locating member is moved laterally — to the right in FIGS. 14 and 19 — by frictional engagement between bar 185 and block 186, until the block engages with stop 193. This movement causes the roller 200, and the bracket 198 to lift, lifting the locating member 177 and projections 178 clear of the film.

The ram continues to move the bar 185 and stop 220 of the feed apparatus moves into contact with the feed member 205. Feed member moves sideways until it engages stop 222. As the feed member 205 moves the fingers, in engagement with the film by means of their lower ends 213 being positioned in perforations in the film, move the film. The fingers cannot pivot clockwise as seen in FIG. 21, as the fingers are in recesses, the top edges of which abut against the top ends of the fingers, at positions indicated at 228 in FIG. 21.

At the end of the lateral movement — to the right — the ram then reverses and moves to the left together with the bar 185. The initial movement of the bar moves the block 186 of the alignment apparatus to the left — FIGS. 14 and 19 until it contacts the stop 192. As this movement occurs the roller 200 runs down the inclined end surface 201, lowering the bracket 198 and thus the locating member 177, under the bias of the springs 180. The projections 178 engage with perforations in the film and correctly locate it. The bar 185 continues to move and stop 221 of the feed apparatus contacts the feed member 205 and it is moved laterally — to the left in FIGS. 14 and 21. The fingers 211 are able to pivot outerclockwise, against the bias of the spring wires 214 and thus ride over the film "clicking" over a predetermined number of perforations. The feed member eventually contacts a stop 229 attached to a support structure 223. At this position the feed apparatus remains stationary with the locating apparatus locating the film accurately for bonding of the lead frame to the semiconductor chip or die.

The various stops 192, 193, 220, 221 and 229 are provided with adjustable abutments in the present example threaded rods, which permit of fine adjustment of the relative positions of the stops.

After a predetermined time period, during which the preform apparatus 112 is actuated and the bonding apparatus positioned at 113 is actuated, the feed cycle is repeated to feed the film on the distance between the centres of two dies or chips. The complete cycle of preforming, bonding, feeding and locating is controlled by a conventional electrical system which actuates the various rams in sequence.

The support structure 223 is connected to the structure supporting the preform apparatus 112 by a beam 230 (FIG. 14), to make a unitary whole. The beam 230 is carried at one end on a moveable support structure 231 which is mounted on two vertical slides 232. A pneumatic ram 233 acts on the support structure 231 and moves the support structure 231 and the beam 230 up and down a small distance. The upward movement of the beam 230 lifts the fibre 110 clear of the support table holding the preassembled dies — indicated at 234. This lifting also lifts the die — which has been bonded to the leads of the lead frame at the bonding station — clear of the substrate from which it has been freed — for example by the hot air through the bonding tool melting the holding wax, as previously described. The ram 233 is actuated to lift the support structure 231 and beam 230 after bonding (and after preforming) while the feed is actuated. When the film has been fed to the next position, the support structure and beam is lowered for a new preforming cycle and bonding cycle. An adjustable abutment 235 is provided for the support structure 231.

FIG. 23 is a front view of one form of machine having the various items previously described, i.e. the preforming 112, the bonding tool 10, sighting prism 100, locating and alignment apparatus 114 and feed mechanism 115. The support beam 230 is carried on a base member 250 mounted for forward and rearward movement on slides 251 and 252. The slides 251 and 252 are in turn mounted on a further member 253 which is mounted for sideways movement on slides, not shown attached to the machine base 254.

What is claimed is:

1. Apparatus for bonding wire leads to contacts on a device, comprising:
    a bonding tool, said tool including an arcuate bonding surface for contact with said leads at a bonding position;
    a support member having a forward end and a rearward end, said bonding tool attached at said forward end;
    means supporting said support member, at said rear end, on a main support structure, said means comprising at two axis pivotal structure;
    said two axis pivotal structure including a pivot for reciprocal rotation of said support member about a first axis extending from said main support structure and tangential to said arcuate bonding surface, said pivot mounted on a pivot support member mounted for reciprocal movement about a second axis normal to said first axis and tangential to said arcuate bonding surface, said first and second axes intersecting on said arcuate bonding surface at a bonding portion thereon;
    means for reciprocating said pivot and said pivot support member about said first and second axes respectively, in a predetermined cycle whereby said bonding position moves over said arcuate bonding surface on a predetermined path.

2. Apparatus as claimed in claim 1, including a bearing member having an arcuate bearing surface centered on said second axis, said pivot support member mounted on said arcuate bearing surface and reciprocal thereon.

3. Apparatus as claimed in claim 1, said means for reciprocating said pivot support member comprising a first rotary cam and a lever system extending between said first cam and said pivot support member; and
    said means for reciprocating said pivot comprising a second rotary cam and a lever system extending between said second cam and said pivot.

4. Apparatus as claimed in claim 1, said bonding tool a supersonic bonding tool, means for applying a weight to said tool and means for applying supersonic vibration to said tool.

5. Apparatus as claimed in claim 4, said support member comprising:
    a horn having a forward end attached to said bonding tool and a rearward end carrying said means for applying supersonic vibrations to said tool; and
    a fork member having a forward end attached to said horn and a rear end attached to said pivot.

6. Apparatus as claimed in claim 5, said fork member pivotally attached at said rear end to said pivot for pivotal movement of said fork member, and said bonding tool in a vertical plane, and means connected to said fork member for lifting said fork member to lift said bonding tool from said intersection position of said first and second axes.

7. Apparatus as claimed in claim 6, said means for lifting said fork member comprising a third rotary cam and a lever system extending between said third cam and said fork member, said third cam having a rotational relationship relative to said first and second cams whereby said fork member and said bonding tool are lifted after said bonding position on said bonding surface of said bonding tool completes one said predetermined cycle.

8. Apparatus as claimed in claim 3, each of said lever systems including a lever having a pivot position intermediate its ends, each said pivot position moveable in a direction parallel to the longitudinal axis of the related lever to vary the pivot position thereof relative to the ends of the lever, whereby the reciprocation of the pivot and the pivot support member can be varied as desired.

9. Apparatus as claimed in claim 1, including a main support structure comprising a frame member slidably supported on colummns for vertical reciprocal movement, said pivot support member attached to said frame member, and means for moving said frame member in said columns to lift and lower said bonding tool from and to an operative position.

10. Apparatus as claimed in claim 9, including a viewing member mounted for reciprocation into a predetermined position for viewing of a device at said operative position when said tool is lifted from said operative position.

11. Apparatus as claimed in claim 10, said viewing member including a reflecting surface whereby said device can be viewed in a microscope.

12. Apparatus as claimed in claim 3, said first and second rotary cams mounted on a common shaft in a predetermined rotational relationship for simultaneous rotation, and means for rotating said shaft.

13. Apparatus as claimed in claim 1, including means for preforming said wire leads prior to bonding the inner ends of said leads to contacts, said leads formed in lead frames, comprising:
  means for successively feeding said lead frames to a preforming position;
  positioning means for positioning each lead frame in a predetermined position at said preforming position;
  forming means at said preforming position for forming said inner ends of said leads into a die to bend said inner ends out of the plane of the lead frame, said inner ends each preformed to include an inclined intermediate portion and a substantially flat end portion.

14. Apparatus as claimed in claim 13, said lead frames comprising a continuous strip and perforations extending at predetermined intervals along said strip, said lead frames positioned in predetermined positional relationship with said perforations, said positioning means comprising locating members for engagement with said perforations.

15. Apparatus as claimed in claim 14, said perforations extending along each side of said strip, and including two locating members, one at each side of said strip.

16. Apparatus as claimed in claim 15, said perforations of substantially rectangular form, one of said locating members engaging on all four sides of one perforation at one side of said strip and the other of said locating members engaging on only two opposed sides of the related perforation at the other side of said strip.

17. Apparatus as claimed in claim 15, said preforming means comprising a support member;
  a support table extending beneath said support member, said die supported on said support table;
  said locating members comprising locating plungers axially slidable in said support member, one on either side of said die and having lower ends for passing through said perforations;
  said forming means including a further plunger axially slidable in said support member and having a lower end for bending said inner ends of said leads, said further plunger positioned over said die; and
  actuating means extending over the upper ends of said locating plungers and said further plunger and moveable downwards, initial downward movement sliding said locating plungers downward to engage with said perforations and position said lead frame, continued movement of said actuating means sliding said further plunger downward to preform said inner ends of said leads.

18. Apparatus as claimed in claim 13, said means for successively feeding said lead frames to said preforming position also feeding said lead frames to said bonding position after preforming.

19. Apparatus as claimed in claim 18, said bonding position including a support member and means for supporting semiconductor chips on said support member for positioning sequentially beneath said bonding means, said wire leads bonded to contacts on said chips.

20. Apparatus as claimed in claim 18, including alignment means adjacent to said bonding position, said alignment means comprising an upper member and a support table extending beneath said support member and an aligning member slidably mounted in said support member for movement towards and away from said support table, said alignment member including two projections extending downward therefrom and positioned to engage with a perforation on each side of said strip.

21. Apparatus as claimed in claim 20, said projections of substantially rectangular form, one of said projections engaging on all four sides of one perforation at one side of said strip and the other of said projections engaging on only two opposed sides of the related perforation at the other side of said strip.

22. Apparatus as claimed in claim 14, said means for successively feeding said strip comprising:
  a feed member;
  a support table extending beneath said feed member;
  a plurality of fingers extending from a lower surface of the feed member, said fingers extending in two rows spaced apart in said feed member and positioned to engage with said perforations on each side of said strip;
  means for reciprocating said feed member in a direction corresponding to the longitudinal axis of said strip;
  said fingers mounted in said feed member to engage with said perforations and move said strip on one direction of movement of said feed member and to disengage from said perforations on the other direction of movement of said feed member.

23. Apparatus as claimed in claim 22, said fingers resiliently mounted in said feed member for retraction from said perforations on said other direction of movement of said feed member.

24. Apparatus as claimed in claim 20, said means for successively feeding said strip comprising:
  a feed member;
  a support table extending beneath said feed member;
  a plurality of fingers extending from a lower surface of the feed member, said fingers extending in two rows spaced apart in said feed member and positioned to engage with said perforations on each side of said strip;
  means for reciprocating said feed member in a direction corresponding to the longitudinal axis of said strip;
  said fingers mounted in said feed member to engage with said perforations and move said strip on one direction of movement of said feed member and to disengage from said perforations on the other direction of movement of said feed member.

25. Apparatus as claimed in claim 24, said means for reciprocating said feed member comprising an axially moveable rod, said rod extending through said support member of said alignment means to actuate said aligning member on said other direction of movement of said feed member.

26. Apparatus as claimed in claim 25, including a lost motion means between said rod and said feed member whereby on initial movement of said rod in a direction corresponding to said one direction of movement of said feed device, said feed device is maintained stationary, said initial movement of said rod actuating said aligning member to disengage from said strip.

* * * * *